United States Patent
Takada et al.

(10) Patent No.: US 9,419,119 B2
(45) Date of Patent: Aug. 16, 2016

(54) SEMICONDUCTOR DEVICE AND MANUFACTURING METHOD THEREOF

(71) Applicant: KABUSHIKI KAISHA TOSHIBA, Tokyo (JP)

(72) Inventors: Yoshiharu Takada, Nonoichi Ishikawa (JP); Takeshi Shibata, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/632,487

(22) Filed: Feb. 26, 2015

(65) Prior Publication Data

US 2016/0079066 A1 Mar. 17, 2016

(30) Foreign Application Priority Data

Sep. 16, 2014 (JP) ................. 2014-187875

(51) Int. Cl.
*H01L 29/778* (2006.01)
*H01L 21/283* (2006.01)
*H01L 29/66* (2006.01)
*H01L 21/28* (2006.01)
*H01L 29/40* (2006.01)

(52) U.S. Cl.
CPC ............ *H01L 29/778* (2013.01); *H01L 21/283* (2013.01); *H01L 21/28008* (2013.01); *H01L 29/66431* (2013.01); *H01L 29/66462* (2013.01); *H01L 29/402* (2013.01)

(58) Field of Classification Search
CPC ............... H01L 2924/13064; H01L 29/66462; H01L 29/778; H01L 29/402
USPC .......................................................... 257/194
See application file for complete search history.

(56) References Cited

U.S. PATENT DOCUMENTS

| | | | |
|---|---|---|---|
| 8,253,169 B2 | 8/2012 | Kawasaki | |
| 8,530,937 B2 | 9/2013 | Aoki | |
| 2011/0272742 A1* | 11/2011 | Akiyama | H01L 21/324 257/194 |
| 2012/0043591 A1* | 2/2012 | Takada | H01L 23/291 257/288 |
| 2015/0061038 A1* | 3/2015 | Takewaki | H01L 27/088 257/401 |

FOREIGN PATENT DOCUMENTS

| | | |
|---|---|---|
| JP | 5386785 B2 | 1/2014 |
| JP | 2014-078557 A | 5/2014 |

* cited by examiner

*Primary Examiner* — Ha Tran T Nguyen
*Assistant Examiner* — Aaron Dehne
(74) *Attorney, Agent, or Firm* — Patterson & Sheridan, LLP

(57) ABSTRACT

A semiconductor device includes a semiconductor region, a first electrode provided on the semiconductor region, a second electrode provided on the semiconductor region adjacent to and spaced from a side of the first electrode, and containing an identical material as the material of the first electrode, a third electrode provided on the semiconductor region in a location between the first electrode and the second electrode, a first insulating film provided between the semiconductor region and the third electrode, and a fourth electrode connected to the third electrode containing the same material as the material of the first electrode and the second electrode.

20 Claims, 9 Drawing Sheets

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2014-187875, filed Sep. 16, 2014, the entire contents of which are incorporated herein by reference.

FIELD

Embodiments described herein relate generally to a semiconductor device and a manufacturing method thereof.

BACKGROUND

In a semiconductor device such as a gallium nitride-based High Electron Mobility Transistor (HEMT), a source electrode is disposed on a gallium nitride layer, and a drain electrode is disposed adjacent and to the side of the source electrode. In addition, a gate electrode is located between the source electrode and the drain electrode. Further, in order to suppress electric field concentration on the gate electrode, a field plate electrode which is electrically connected to the gate electrode may be provided.

Here, the field plate electrode, the source electrode, and the drain electrode are formed by different processes. For this reason, the number of process steps in a manufacturing process is not able to be reduced, and cost reduction in a semiconductor device is not able to be realized.

DETAILED DESCRIPTION

A semiconductor device which is able to be manufactured with fewer process steps and associated lower cost than a reference example, and a manufacturing method thereof, are provided herein.

In general, according to one embodiment, a semiconductor device includes: a semiconductor region; a first electrode provided on the semiconductor region; a second electrode provided on the semiconductor region, spaced from the side of the first electrode, and comprising a material identical to a material of the first electrode; a third electrode provided on the semiconductor region, at a location between the first electrode and the second electrode; a first insulating film provided between the semiconductor region and the third electrode; and a fourth electrode connected to the third electrode, and comprising a material identical to the material of the first electrode and the second electrode.

Hereinafter, each embodiment hereof will be described with reference to the accompanying drawings.

In the present disclosure, the same reference numbers and symbols for structures configured the same or substantially the same as those described previously in one or more Figures are given the same reference numbers or symbols, and detailed descriptions thereof are appropriately omitted.

First Embodiment

Figure 1A:
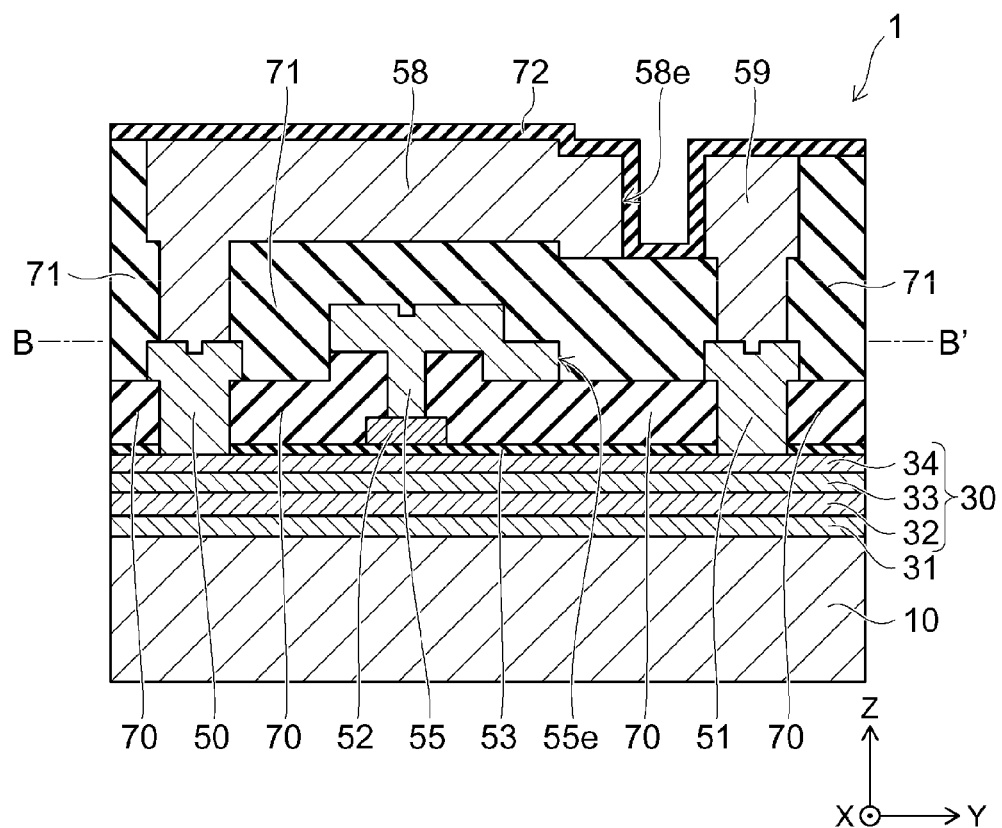
FIG. 1A is a schematic cross-sectional view illustrating a cross-sectional of a portion of the semiconductor device of the first embodiment hereof cut along line A-A' of FIG. 1B.
Figure 1B:
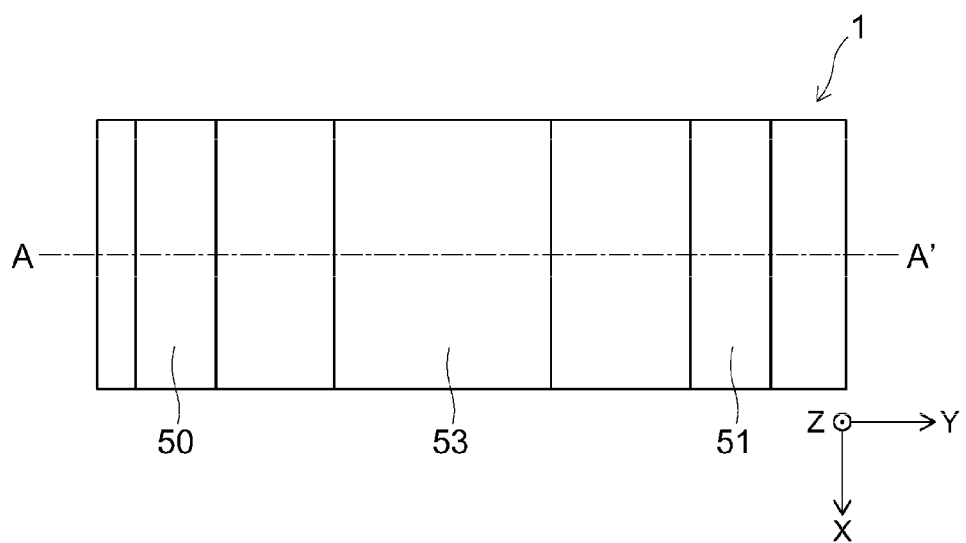
FIG. 1B is a schematic plan view of the portion of the semiconductor device of the first embodiment opened at line B-B' of FIG. 1A when viewed from above.

FIG. 1A is a schematic cross-sectional view illustrating a cross-sectional surface cut along line A-A' of FIG. 1B, in a main part of a semiconductor device according to a first embodiment, and FIG. 1B is a schematic plan view of the surface of the substrate device cut along line B-B' of FIG. 1A when viewed from above.

A semiconductor device 1 according to a first embodiment is, for example, an HEMT. The semiconductor device 1 includes a substrate 10, a semiconductor region 30, a first electrode 50 (hereinafter, for example, a source electrode 50), a second electrode 51 (hereinafter, for example, a drain electrode 51), a third electrode 52 (hereinafter, for example, a gate electrode 52), a fourth electrode 55 (hereinafter, for example, a gate field plate electrode 55), and a first insulating film 53 (hereinafter, for example, a gate insulating film 53).

The substrate 10 is, for example, a silicon substrate. A buffer layer 31 is formed on the substrate 10, and the semiconductor region 30 is disposed on the substrate 10 over the buffer layer 31. The buffer layer 31 is an aluminum nitride (AlN)-containing layer. The semiconductor region 30 is a nitride semiconductor. The semiconductor region 30 includes an aluminum gallium nitride (AlGaN)-containing layer 32, a gallium nitride (GaN)-containing layer 33, and an aluminum gallium nitride (AlGaN)-containing layer 34.

The buffer layer 31 and the aluminum gallium nitride-containing layer 32 function as a buffer layer for the HEMT device. The gallium nitride-containing layer 33 functions as a carrier generating layer of the HEMT. The aluminum gallium nitride-containing layer 34 functions as a barrier layer of the HEMT. The aluminum gallium nitride-containing layer 34 is a non-doped layer or an n-type $Al_xGa_{1-x}N$ ($0<X≤1$) layer. In the vicinity of an interface between the gallium nitride-containing layer 33 and the aluminum gallium nitride-containing layer 34 in the gallium nitride-containing layer 33, a two dimensional electron gas region (2DEG), i.e., a two dimensional region where electrons have high mobility, is generated.

The source electrode 50 is disposed on the semiconductor region 30. The drain electrode 51 is disposed on the semiconductor region 30. The lowermost surface of the drain electrode 51 is generally parallel to the lowermost surface of the source electrode 50. The drain electrode 51 includes a material identical to a material of the source electrode 50. The source electrode 50 and the drain electrode 51 are in Ohmic contact with the aluminum gallium nitride-containing layer 34.

The gate insulating film 53 is disposed on the portion of the semiconductor region 30 on which the source electrode 50 and the drain electrode 51 do not contact. The gate insulating film 53 includes any one of a silicon nitride film (SiNx), a silicon oxide film (SiOx), and an aluminum oxide (AlOx) film.

The gate electrode 52 is located on the gate insulating film 53, and thus the gate insulating film 53 is disposed between the semiconductor region 30 and the gate electrode 52. The gate electrode 52 is also located between the source electrode 50 and the drain electrode 51. The gate electrode 52 includes titanium and nitrogen. For example, the gate electrode 52 includes titanium nitride (TiN).

The gate field plate electrode 55 is connected to the gate electrode 52. The gate field plate electrode 55 includes a material identical to the material of the source electrode 50 and the drain electrode 51. That is, the source electrode 50, the drain electrode 51, and the gate field plate electrode include the same material. For example, the source electrode 50, the drain electrode 51, and the gate field plate electrode 55 include titanium (Ti), aluminum (Al), and nitrogen (N). An end portion 55e of the gate field plate electrode 55 is positioned between the gate electrode 52 and the drain electrode 51.

In addition, the semiconductor device 1 includes a second insulating film 70 (hereinafter, for example, an interlayer insulating film 70) disposed on the gate insulating film 53, and on a part of the gate electrode 52. The interlayer insulating film 70 includes any one of a silicon nitride film (SiNx), a silicon oxide film (SiOx), and an aluminum oxide (AlOx) film.

An interlayer insulating film 71 is disposed on the interlayer insulating film 70, on the gate field plate electrode 55, and on portions of the source electrode 50 and the drain electrode 51. The interlayer insulating film 71 includes any one of a silicon nitride film (SiNx), a silicon oxide film (SiOx), and an aluminum oxide (AlOx). Further, a source field plate electrode 58 is connected to the source electrode 50. An end portion 58e of the source field plate electrode 58 is positioned at a location between the gate electrode 52 and the drain electrode 51. A contact electrode 59 is connected to the drain electrode 51. A protective film 72 is disposed on the interlayer insulating film 71, on the source field plate electrode 58, and on the contact electrode 59.

A manufacturing method of the semiconductor device 1 will be described.

FIGS. 2A to 5B are schematic cross-sectional views which illustrate results of several manufacturing steps of the semiconductor device according to the first embodiment and correspond to the cross-sectional surface cut along line A-A' of FIG. 1B.

Figure 2A:
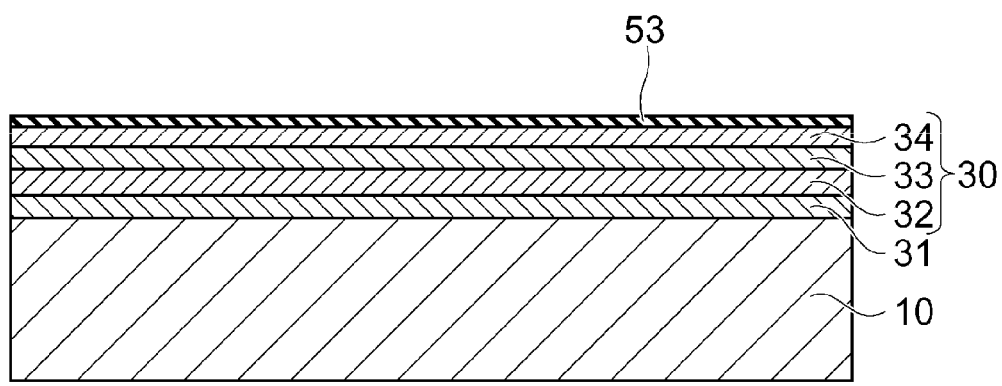
FIGS. 2A and 2B are schematic cross-sectional views which illustrate a manufacturing procedure of the semiconductor device according to the first embodiment and correspond to the cross-sectional surface cut along line A-A' of FIG. 1B.

As illustrated in FIG. 2A, the buffer layer 31 is epitaxially grown on the substrate 10, such as on a silicon substrate. Subsequently, the aluminum gallium nitride-containing layer 32, the gallium nitride-containing layer 33, and the aluminum gallium nitride-containing layer 34 are epitaxially grown on the substrate 10 in this order over the buffer layer 31. Accordingly, the semiconductor region 30 is formed on the substrate 10 over the buffer layer 31. Thereafter, the gate insulating film 53 is formed on the semiconductor region 30.

Figure 2B:
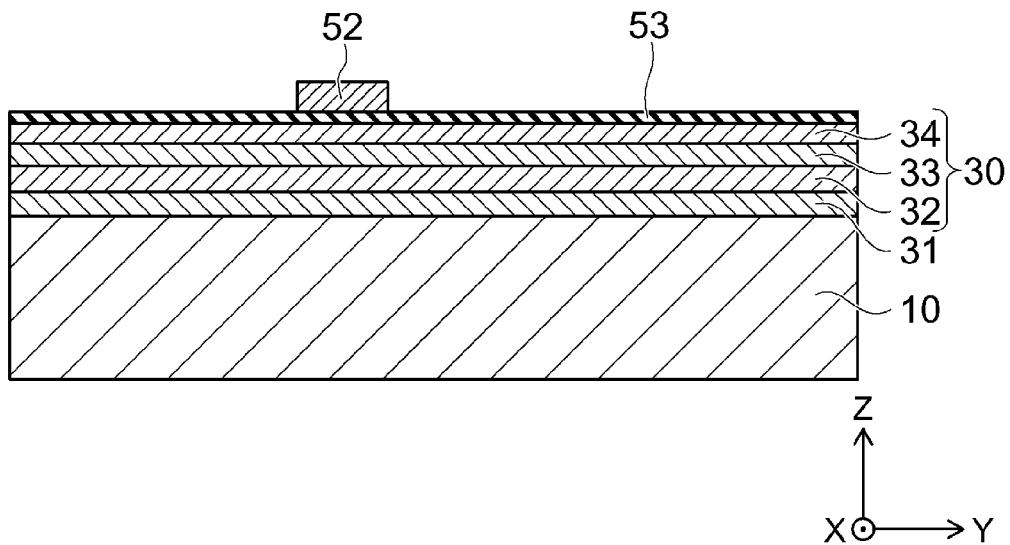

Next, as illustrated in FIG. 2B, the gate electrode 52 is selectively formed on the gate insulating film 53 on the semiconductor region 30. A film layer for forming the gate electrode 52 is formed by a sputtering method using a sputtering target material. Accordingly, the gate electrode 52 is a coated film which is denser than a coated film formed by a vacuum evaporation deposition method. In addition, the gate electrode 52 is selectively formed by pattern etching the sputtered film layer to form (separate) the gate electrode 52 therefrom.

Here, the gate electrode 52 is a film layer including at least one of titanium (Ti), molybdenum (Mo), tungsten (W), and nitrogen (N). For example, the gate electrode 52 includes titanium nitride (TiN).

Figure 3A:
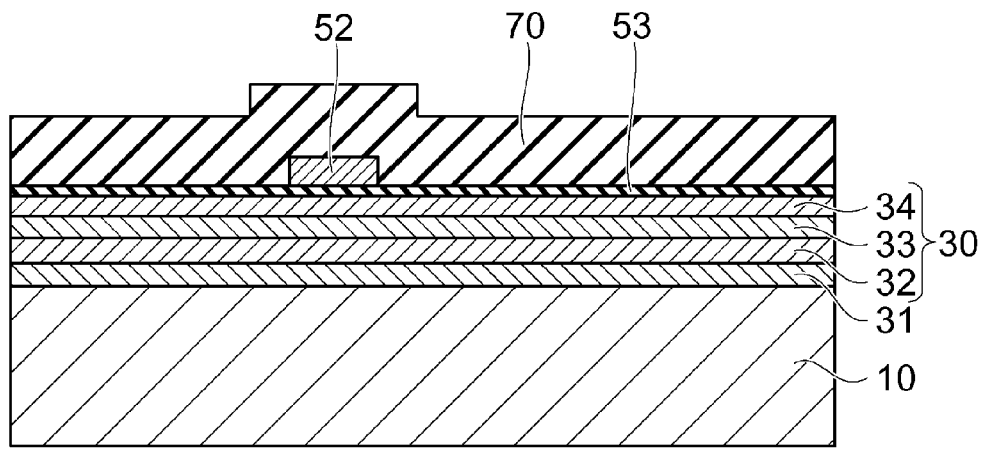
FIGS. 3A and 3B are schematic cross-sectional views which illustrate the results of steps of a manufacturing procedure of the semiconductor device according to the first embodiment and correspond to the cross-sectional surface cut along line A-A' of FIG. 1B.

Next, as illustrated in FIG. 3A, the interlayer insulating film 70 is formed on the gate insulating film 53, and on the gate electrode 52.

Figure 3B:
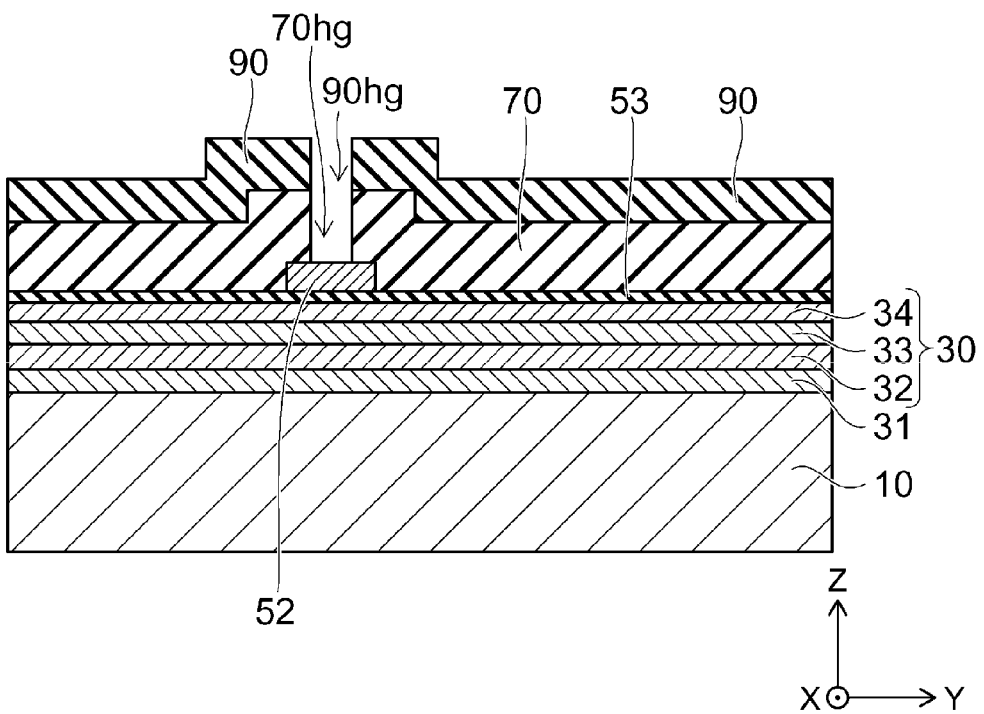

Next, as illustrated in FIG. 3B, a mask layer 90 provided with an opening 90hg is formed on the interlayer insulating film 70. The opening 90hg is, for example, positioned on an upper side of the gate electrode 52. Subsequently, the interlayer insulating film 70 exposed in the opening 90hg is, for example, etched by a Reactive Ion Etching (RIE) method. Accordingly, a first opening 70hg (hereinafter, an opening 70hg) is formed in the interlayer insulating film 70. Thus, a portion of the gate electrode 52 is exposed in the opening 70hg in the interlayer insulating film 70. Thereafter, the mask layer 90 is removed.

Figure 4A:
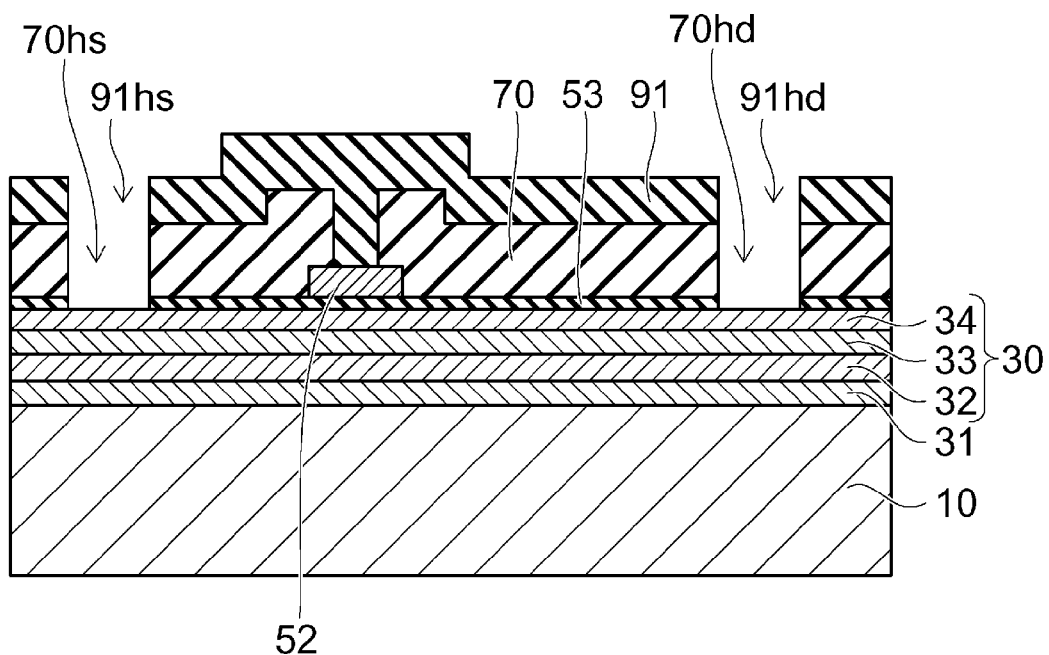
FIGS. 4A and 4B are schematic cross-sectional views which illustrate the results of steps of a manufacturing procedure of the semiconductor device according to the first embodiment and correspond to the cross-sectional surface cut along line A-A' of FIG. 1B.

Next, as illustrated in FIG. 4A, a mask layer 91 provided with an opening 91hs and an opening 91hd is formed on the interlayer insulating film 70. The opening 91hs is located at the contacting location of the source electrode 50 and the aluminum gallium nitride-containing layer 34. The opening 91hd is located at the contacting location of the drain electrode 51 and the aluminum gallium nitride-containing layer 34.

Subsequently, the portion of the interlayer insulating film 70 exposed in the openings 91hs and 91hd is, for example, etched by an RIE method. Further, the gate insulating film 53 exposed by the openings 91hs and 91hd is etched by an RIE method. Accordingly, in the gate insulating film 53 and the interlayer insulating film. 70, a second opening (hereinafter, for example, an opening 70hs) and a third opening (hereinafter, for example, an opening 70hd) which expose the semiconductor region 30 therein are formed. The opening 70hg is interposed between the opening 70hs and the opening 70hd. Thereafter, the mask layer 91 is removed.

The opening 70hg is positioned in a center portion of the gate electrode 52 in the Y direction, but the opening 70hg may be shifted from the center portion of the gate electrode 52 in the direction of the opening 70hd. Such a shifted structure will be described later.

Figure 4B:
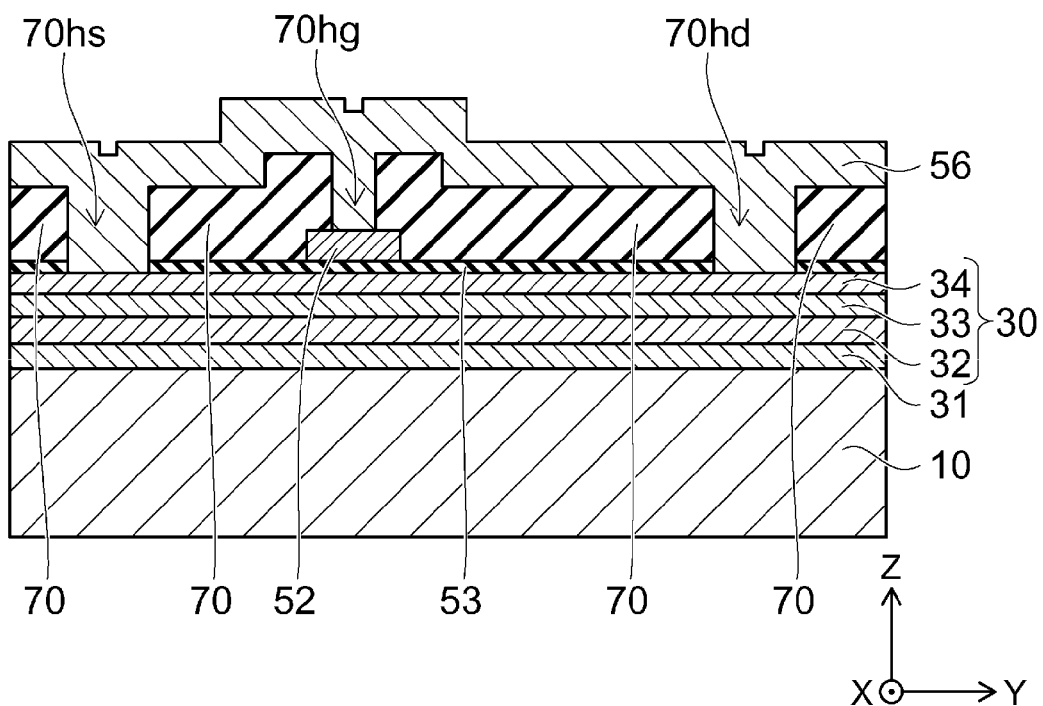

Next, as illustrated in FIG. 4B, an electrode layer 56 is formed in the opening 70hg, in the opening 70hs, in the opening 70hd, and on the interlayer insulating film 70 by a sputtering method. The electrode layer 56 comprises, for example, any one of titanium (Ti), aluminum (Al), nickel (Ni), and gold (Au).

After forming the electrode layer 56, the electrode layer 56 and the semiconductor region 30 are subjected to heat treatment (for example, at 500° C. to 550° C.). By this heat treatment, an Ohmic contact between the electrode layer 56 and the aluminum gallium nitride-containing layer 34 is reliably formed.

Figure 5A:
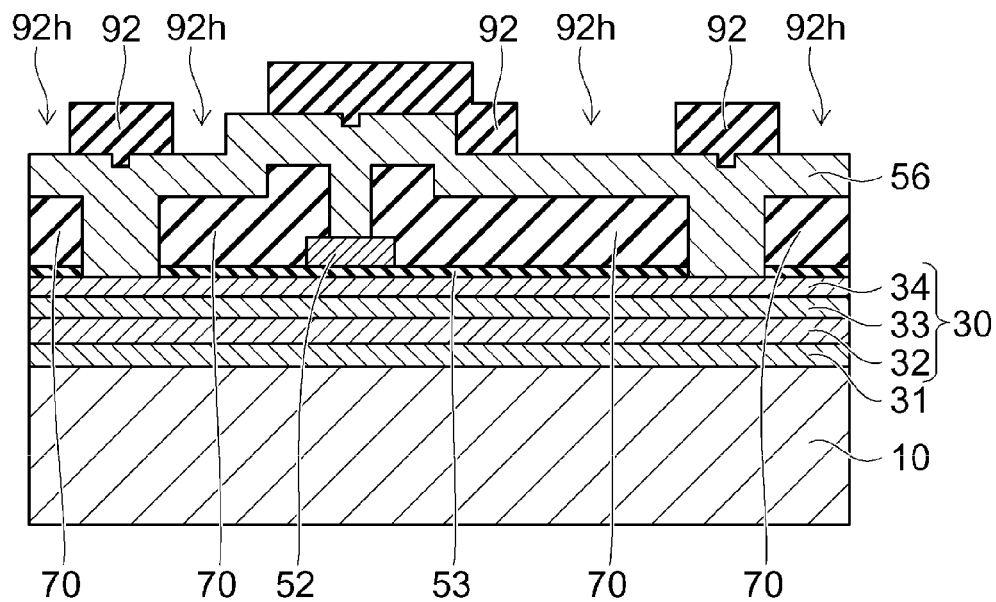
FIGS. 5A and 5B are schematic cross-sectional views which illustrate the results of steps of a manufacturing procedure of the semiconductor device according to the first embodiment and correspond to the cross-sectional surface cut along line A-A' of FIG. 1B.

Next, as illustrated in FIG. 5A, a mask layer 92, provided with a plurality of openings 92h therethrough, is formed on the electrode layer 56.

Figure 5B:
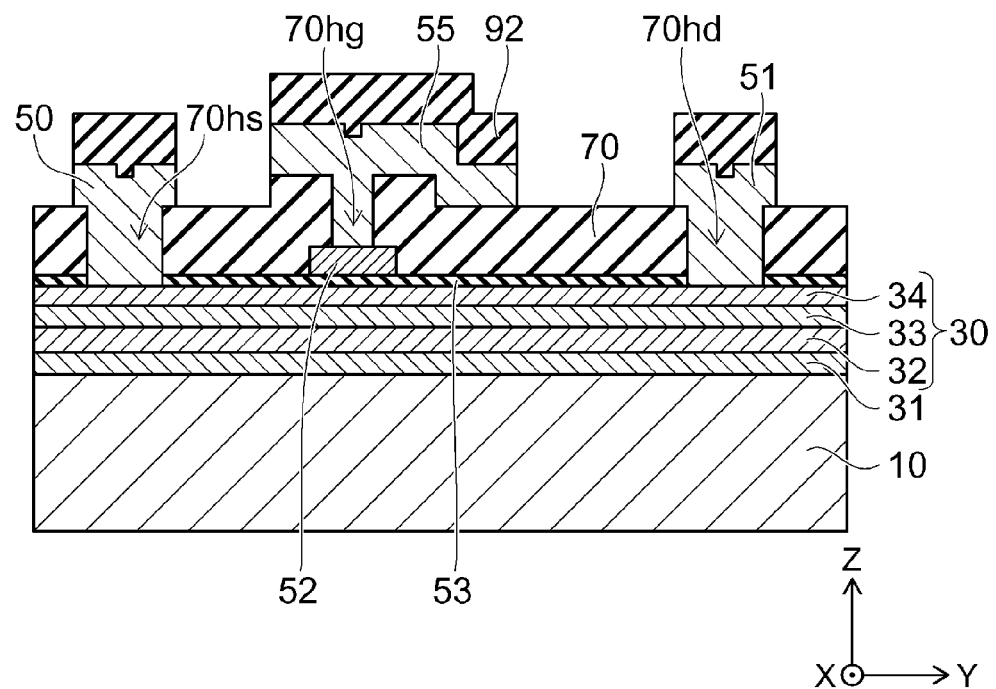

Next, as illustrated in FIG. 5B, the electrode layer 56 exposed in the openings 92h is etched by, for example, an RIE method.

Accordingly, portions of the electrode layer 56 are removed, and thus the source electrode 50 connected to the semiconductor region 30 through the opening 70hs, the drain electrode 51 connected to the semiconductor region 30 through the opening 70hd, and the gate field plate electrode 55 connected to the gate electrode 52 through the opening 70hg are formed. Thereafter, the mask layer 92 is removed.

The source electrode 50, the drain electrode 51, and the gate field plate electrode 55 are formed of the material of the electrode layer 56, and the source electrode 50, the drain electrode 51, and the gate field plate electrode 55 are thus composed of the same material.

Thereafter, as shown in FIG. 1A, the interlayer insulating film 71, the source field plate electrode 58, the contact electrode 59, and the protective film 72 are formed.

In addition, in the first embodiment, the gate electrode 52 is formed by a sputtering method. Accordingly, a high melting point metal (for example, titanium (Ti), tungsten (w), and molybdenum (Mo)), or a nitride of high melting point metal, is used as a material of the gate electrode 52.

For example, when a high melting point metallic film is formed by a vacuum evaporation deposition method, a melting point of the high melting point metal is high, and thus the deposition rate thereof is reduced.

For this reason, when the chemical vapor deposition method is adopted, in general, a high melting point metal is not used as the material of the gate electrode 52. When the chemical vapor deposition method is adopted, for example, aluminum (Al), gold (Au), platinum (pt), and the like are used as the material of the gate electrode 52 instead of the high melting point metal.

However, when aluminum (Al), gold (Au), platinum (pt), and the like are used as the material of the gate electrode 52, aluminum (Al), gold (Au), platinum (pt), and the like may be diffused into the gate insulating film. 53 during subsequent annealing or heating steps during the manufacturing of the semiconductor device. As a result, the insulating properties of the gate insulating film 53 may deteriorate.

In contrast, in the first embodiment, a high melting point metal or a nitride of the high melting point metal is used as the material of the gate electrode 52. Accordingly, it is not easy for a metallic component of the gate electrode material to diffuse into the gate insulating film 53 during subsequent heating or annealing process steps, and thus the electrical insulating properties of the gate insulating film 53 are not deteriorated.

In addition, in the first embodiment, the gate field plate electrode 55 is formed at the same time as the source electrode 50 and the drain electrode 51. That is, the gate field plate electrode 55 is not formed after the source electrode 50 and the drain electrode 51 are formed, but is formed simultaneously with the source electrode 50 and the drain electrode 51. Accordingly, the number of manufacturing process steps is reduced, and thus manufacturing yield may be improved. Further, it is possible to manufacture the semiconductor device 1 at lower cost.

Second Embodiment

Figure 6A:
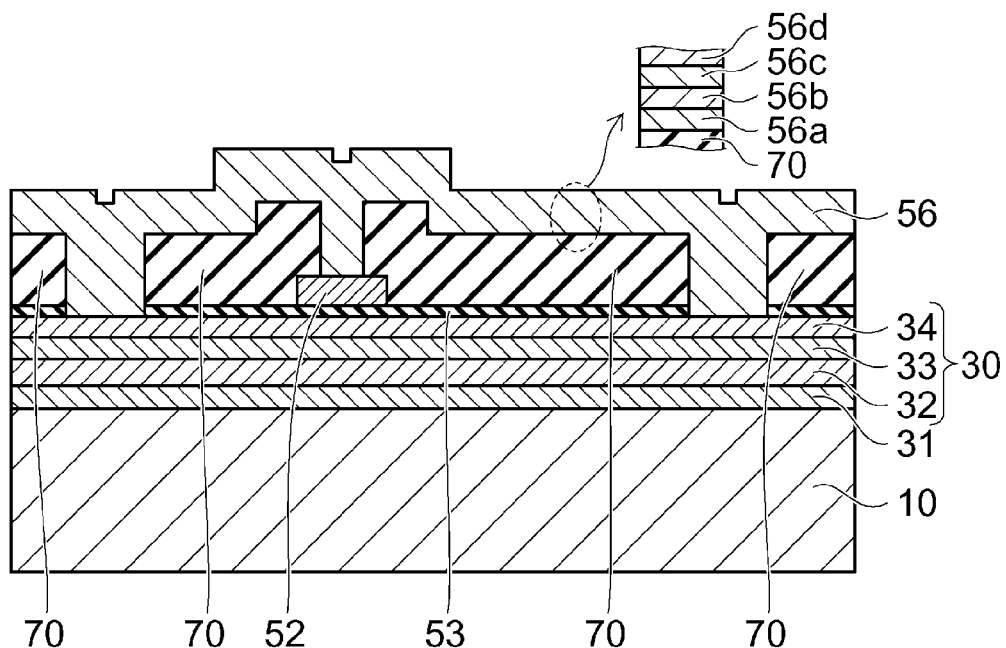
FIGS. 6A and 6B are schematic cross-sectional views which illustrate the results of steps of a manufacturing procedure of a semiconductor device according to a second embodiment and correspond to the cross-sectional surface cut along line A-A' of FIG. 1B.
Figure 6B:
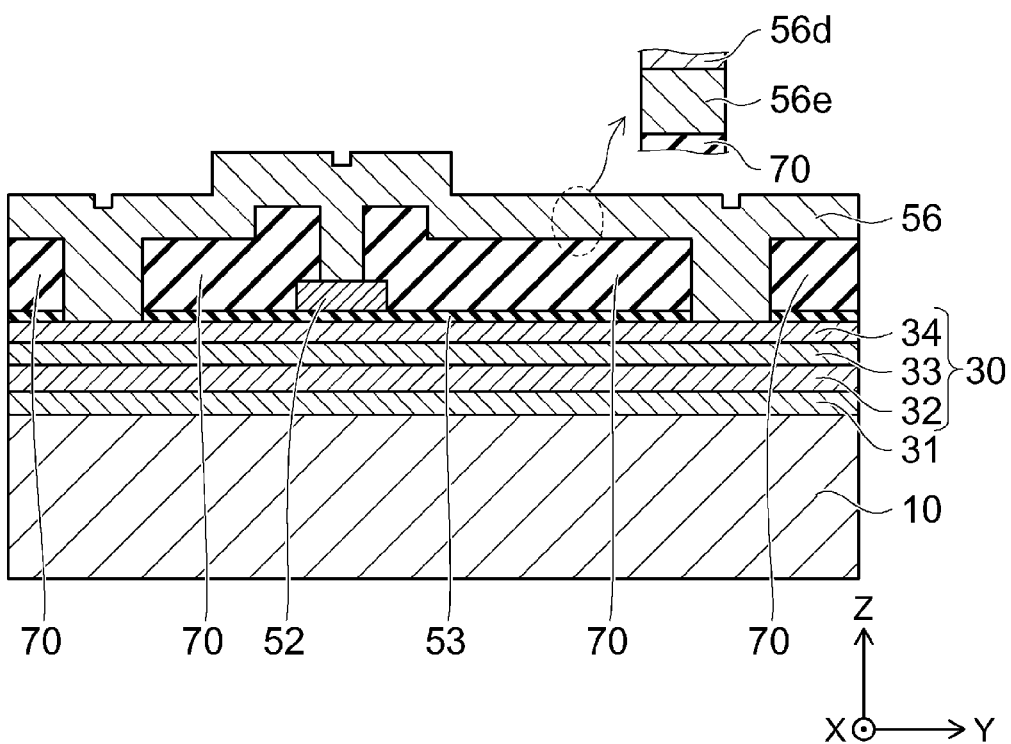

FIGS. 6A and 6B are schematic cross-sectional views which illustrate the results of a manufacturing procedure of a semiconductor device according to a second embodiment and correspond to the cross-sectional surface cut along line A-A' of FIG. 1B.

The electrode layer 56 formed on the interlayer insulating film 70 is not limited to a single uniform material composition layer. For example, as illustrated in FIG. 6A, the electrode layer 56 may be a multi-layer film in which a titanium (Ti) film 56a, an aluminum (Al) film 56b, a titanium (Ti) film 56c, and a titanium nitride (TiN) film 56d are formed and thus stacked on each other in this order. Each film of the electrode layer 56 is formed by a sputtering method. After forming the multi-layer electrode layer 56 film, the electrode layer 56 and the semiconductor region 30 are subjected to a rapid thermal anneal treatment (for example, 500° C. to 550° C.) By this heat treatment, an Ohmic contact between the electrode layer 56 and the aluminum gallium nitride-containing layer 34 is reliably formed at the interface thereof.

In the second embodiment, the same effects as that of the first embodiment are obtained. Further, by the heat treatment step described above, as an example, the following chemical reaction is progressed in an interface between the electrode layer 56 and the semiconductor region 30.

For example, the titanium film 56a functions as a gettering film which removes a natural (native) oxide film on a front surface of the aluminum gallium nitride-containing layer 34. In addition, the aluminum film 56b reacts with the aluminum gallium nitride-containing layer 34 from which the natural oxide film is removed. Accordingly, at the interface between the electrode layer 56 and the semiconductor region 30, an n-type Ohmic contact is reliably formed.

Here, during the heat treatment step, the titanium nitride film 56d functions as a capping film which prevents oxidation of the titanium film 56a, the aluminum film 56b, and the titanium film 56c. Accordingly, after the heat treatment, a shape of a front surface of the electrode layer 56 is flat having a small number of concavities and convexities.

In addition, after the heat treatment, below the titanium nitride film 56d, the respective titanium film 56a, aluminum film 56b, and titanium film 56c are diffused into each other, and thus a continuous alloyed layer 56e including titanium, aluminum, and nitrogen is formed. This state is illustrated in FIG. 6B.

The layer 56e includes titanium aluminum in which titanium is alloyed with aluminum. In the second embodiment, the electrode layer 56, including the alloyed layer 56e, is etched by an RIE process through a patterned mask, and thus the source electrode 50, the drain electrode 51, and the gate field plate electrode 55 are individually formed therefrom.

When the electrode layer 56 is etched by RIE without alloying the three sub-layers below the titanium nitride film 56d, the aluminum film 56b may be preferentially etched away during the etching step. Such a phenomenon is illustrated in FIGS. 7A to 7C as a reference example.

Figure 7A:
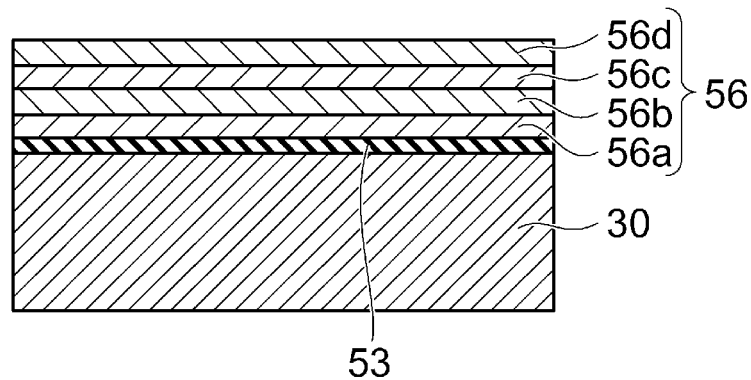
FIGS. 7A to 7C are schematic cross-sectional views which illustrate the results of steps of a manufacturing procedure of a semiconductor device according to a reference example, and illustrate a procedure in which an electrode layer is separated into a gate field plate electrode and a drain electrode.
Figure 7B:
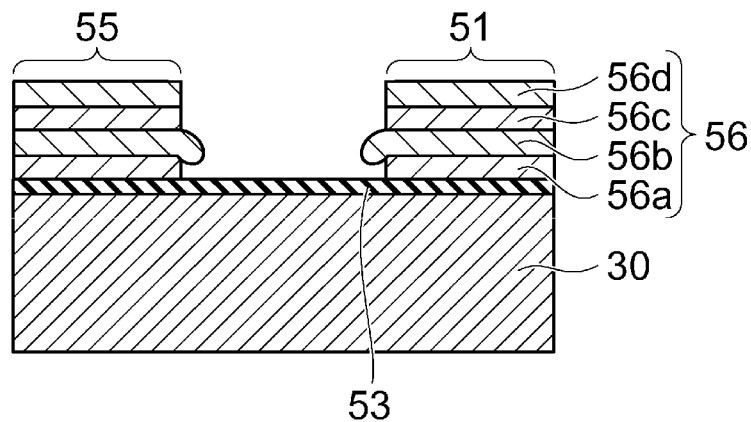
Figure 7C:
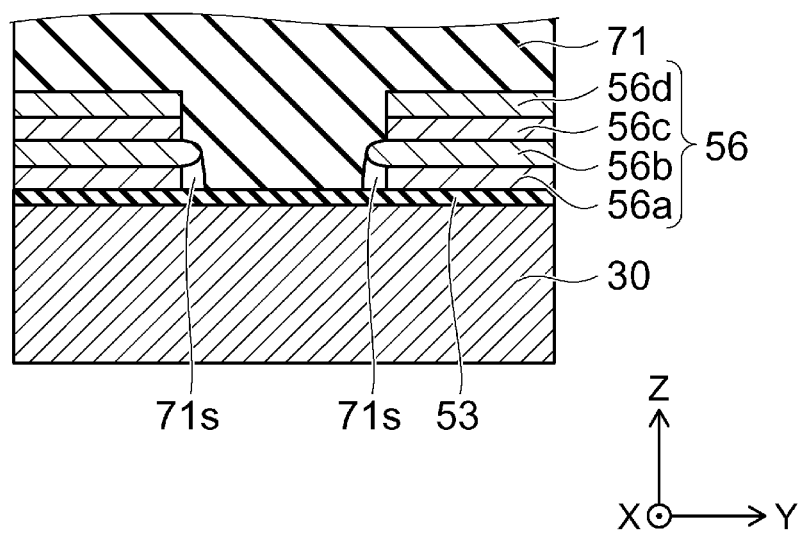

FIGS. 7A to 7C are schematic cross-sectional views which illustrate the result of a manufacturing procedure of a semiconductor device according to a reference example, and illustrate a procedure in which the electrode layer is etched to form the gate field plate electrode and the drain electrode.

As illustrated in FIG. 7A, the electrode layer 56 in which the titanium (Ti) film 56a, the aluminum (Al) film 56b, the titanium (Ti) film 56c, and the titanium nitride (TiN) film 56d are stacked in this order is formed on the interlayer insulating film 70.

After that, in the reference example, the electrode layer 56 is etched by RIE without first heating the electrode layer 56 to alloy the materials thereof into a single film layer alloy, from which the source electrode 50, the drain electrode 51, and the gate field plate electrode 55 will be formed. This state is illustrated in FIG. 7B. As illustrated in FIG. 7B, the aluminum film 56b may be undercut during etching, inwardly of a side surface of the etched opening. This is because a melting point of aluminum is lower than a melting point of titanium and it is more rapidly etched that the remaining materials in the film layer stack.

Thereafter, as illustrated in FIG. 7C, when the interlayer insulating film 71 is formed on the gate field plate electrode 55, on the gate insulating film 53, and on the drain electrode 51, coatability of the interlayer insulating film 71 in the vicinity of a portion into which the aluminum film 56b is undercut is deteriorated. Accordingly, in the vicinity of the portion into which the aluminum film 56b is undercut, a gap 71s of the interlayer insulating film 71 may be formed. When a chemical solution or the like is used in the manufacturing procedure, the chemical solution may reach this gap 71s and the gate field plate electrode 55, the drain electrode 51, the gate insulating film 53, or the like may be deteriorated in addition to the interlayer insulating film 71.

In contrast, in the second embodiment, the three layers below the titanium nitride film 56d are alloyed, and thus a phenomenon in which the aluminum film 56b is undercut inwardly of the side surface of the opening is avoided. Accordingly, the gap 71s is not formed.

In addition, in the second embodiment, as the material of the electrode layer 56, gold (Au) or similar expensive materials are not used. Accordingly, cost reduction of the semiconductor device is further realized.

Third Embodiment

Figure 8A:
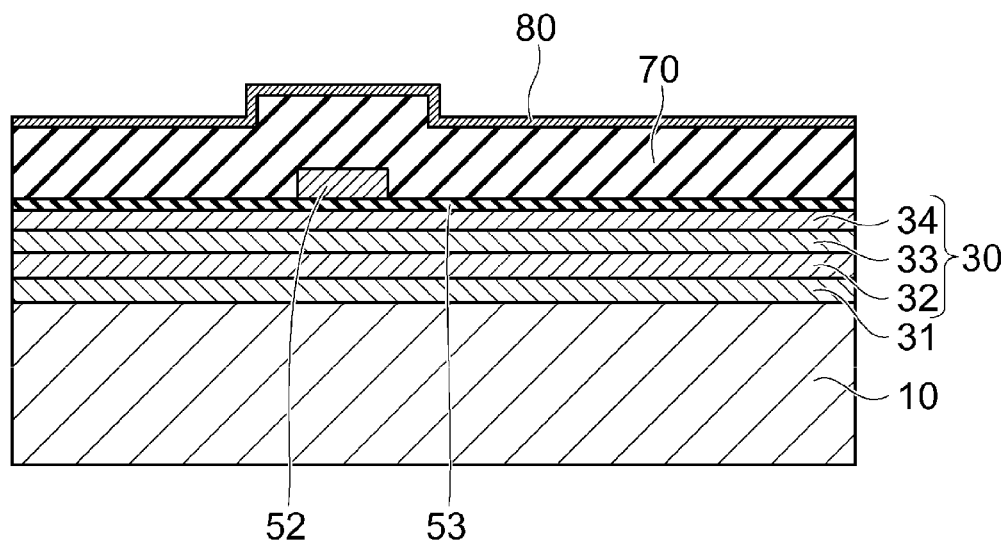
FIGS. 8A and 8B are schematic cross-sectional views which illustrate the results of steps of a manufacturing procedure of a semiconductor device according to a third embodiment and correspond to the cross-sectional surface cut along line A-A' of FIG. 1B.
Figure 8B:
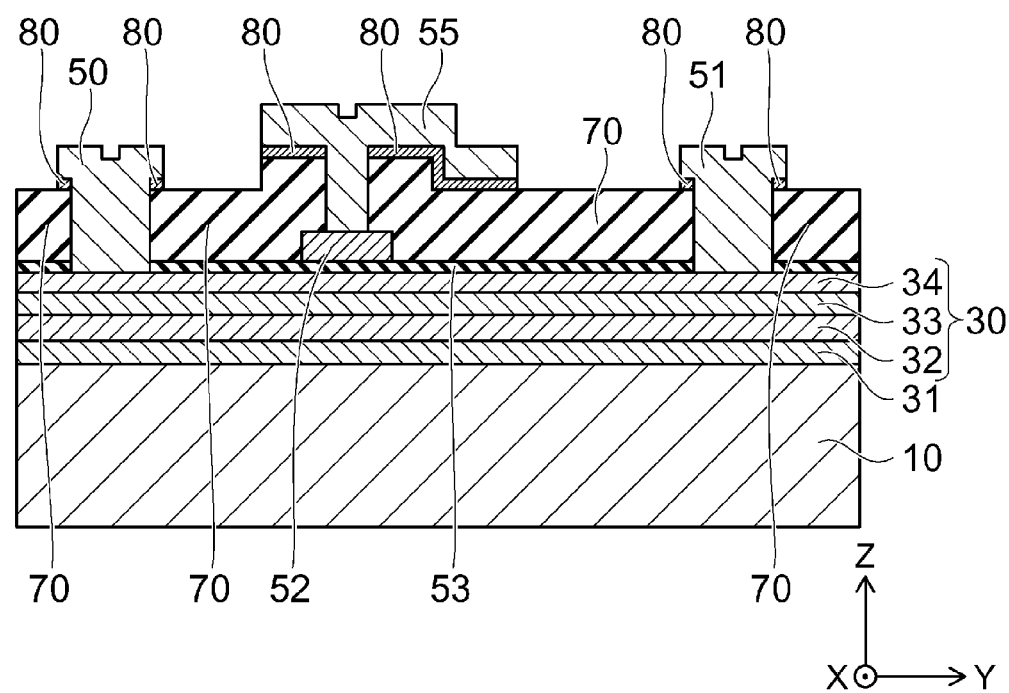

FIGS. 8A and 8B are schematic cross-sectional views which illustrate a manufacturing procedure of a semiconductor device according to a third embodiment and correspond to the cross-sectional surface cut along line A-A' of FIG. 1B.

For example, as illustrated in FIG. 8A, the interlayer insulating film 70 is formed on the gate insulating film 53, and on the gate electrode 52, and then a barrier film 80 is formed on the interlayer insulating film 70. The barrier film 80 includes, for example, titanium nitride (TiN).

Subsequently, the manufacturing procedure progresses as in the first embodiment, and thus the source electrode 50 and the drain electrode 51 connected to the semiconductor region 30, and the gate field plate electrode 55 connected to the gate electrode 52 are formed.

Accordingly, as illustrated in FIG. 8B, a structure in which the barrier film 80 is disposed on apart of the interlayer insulating film 70 is formed. In this structure, a part of the source electrode 50, a part of the drain electrode 51, and a part of the gate field plate electrode 55 are respectively disposed over a portion of the barrier film 80 and thus over a portion of the interlayer insulating film 70 thereunder.

According to this structure, in addition to the effects of the first and the second embodiments, metal diffusion from the source electrode 50, the drain electrode 51, and the gate field plate electrode 55 into the interlayer insulating film 70 is further suppressed.

Fourth Embodiment

Figure 9:
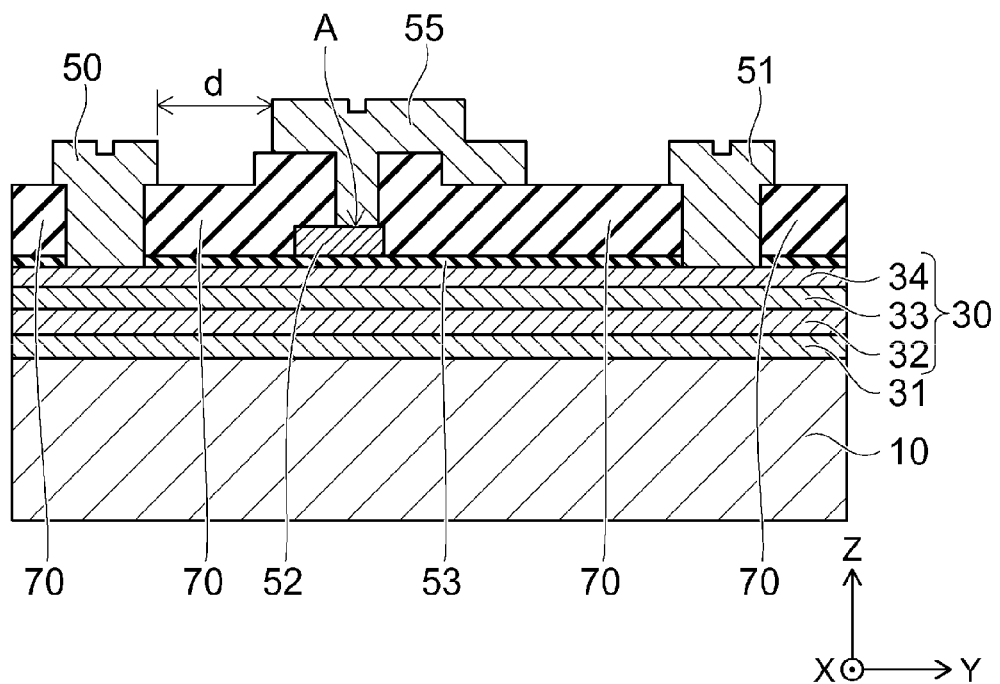
FIG. 9 is a schematic cross-sectional view illustrating a main part of the semiconductor device according to a fourth embodiment.

FIG. 9 is a schematic cross-sectional view illustrating a main part of the semiconductor device according to the fourth embodiment.

A portion A at which the gate field plate electrode 55 is connected to the gate electrode 52 is shifted or offset from a center portion of the gate electrode 52 to the side of the drain electrode 51 in the direction of the drain electrode 51.

According to this structure, a distance d between the source electrode 50 and the gate field plate electrode 55 is increased as compared to the first to the third embodiments. Accordingly, step coatability (step coverage) of the interlayer insulating film 71 disposed between the source electrode 50 and the gate field plate electrode 55 is improved.

Furthermore, herein, the "nitride semiconductor" includes a semiconductor of all compositions in which composition ratios x, y, and z are changed within each range in a chemical formula of $B_x In_y Al_z Ga_{1-x-y-z} N$ ($0 \leq x \leq 1$, $0 \leq y \leq 1$, $0 \leq z \leq 1$, and $x+y+z \leq 1$). Further, semiconductors which further include group V elements other than nitrogen (N), further include various elements added for controlling various physical properties such as conductivity, and further include unintentionally included various elements in the chemical formula described above are included in the "nitride semiconductor".

In the embodiment described above, "on" in the phrase "a portion A is provided on a portion B" includes the case where the portion A does not come into contact with the portion B and the portion A is provided above the portion B in addition to the case where the portion A comes into contact with the portion B and the portion A is provided directly on the portion B. Furthermore, the phrase "the portion A is provided on the portion B" may be applied to a case where the portion A and the portion B are reversed and the portion A is positioned below the portion B, or a case where the portion A and the portion B are horizontally provided in the same line with each other. This is because the structure of the semiconductor device is not changed upon rotation even if the semiconductor device according to the embodiment is rotated.

Hitherto, the embodiments are described with reference to the specific examples. However, the embodiments are not limited to the specific examples. That is, one in which those skilled in the art apply appropriate design changes to those specific examples is included in the range of the embodiments as long as it includes the characteristics of the embodiments. Each element included in the specific examples and, a disposition, a material, a condition, a shape, a size thereof, and the like are not limited to those which are illustrated above and can be appropriately changed.

Furthermore, each of the elements included in each embodiment can be combined as long as it is technically possible and the combination is included in the range of the embodiments as long as each of the elements includes the characteristics of the embodiments. In addition, in a category of the spirit of the embodiments, those skilled in the art can derive various modified examples and corrected examples, and the modified examples and the corrected examples are understood to be also included in the range of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor region;
a first electrode provided on the semiconductor region and comprising a first material;
a second electrode provided on the semiconductor region spaced from the first electrode in a first direction, and comprising a second material identical to the first material;
a third electrode provided on the semiconductor region in a location between the first electrode and the second electrode along the first direction;
a first insulating film provided between the semiconductor region and the third electrode; and
a fourth electrode connected to the third electrode, and comprising a material identical to the first material, wherein an end portion of the fourth electrode is between the second electrode and the third electrode along the first direction.

2. The device according to claim 1,
wherein the first electrode, the second electrode, and the fourth electrode comprise a first layer of titanium, aluminum, and nitrogen, and a second layer of titanium nitride.

3. The device according to claim 1,
wherein the third electrode contains at least any one of titanium, molybdenum, tungsten, and nitrogen.

4. The device according to claim 1, further comprising:
a second insulating film provided on the first insulating film, and on a portion of the third electrode.

5. The device according to claim 4, further comprising:
a barrier film provided on a portion of the second insulating film,
wherein a part of the first electrode, a part of the second electrode, and a part of the fourth electrode respectively extend over the portion of the second insulating film, with the barrier film therebetween.

6. The device according to claim 1,
wherein a portion of the fourth electrode that is connected to the third electrode is shifted from a center portion of the third electrode toward a side of the second electrode, and in a direction toward the second electrode.

7. The device according to claim 1, wherein the first electrode and the second electrode are in Ohmic contact with the semiconductor layer.

8. A manufacturing method of a semiconductor device, comprising:
selectively forming a third electrode on a first insulating film on a semiconductor region;
forming a second insulating film on the first insulating film, and on the third electrode;
forming a first opening in the second insulating film and exposing at least a portion of the third electrode in the opening in the second insulating film, and forming a second opening and a third opening in the second insulating film and the first insulating film and exposing the semiconductor region below the first insulating film and the second insulating film within the openings, the first opening formed between the second opening and the third opening;
forming an electrode layer in the first opening, in the second opening, in the third opening, and on the second insulating film; and
etching the electrode layer and forming a first electrode connected to the semiconductor region through the second opening, a second electrode connected to the semiconductor region through the third opening, and a fourth electrode connected to the third electrode through the first opening, wherein
the forming of the electrode layer includes:
forming a multilayered film in which a titanium film, an aluminum film, a titanium film, and a titanium nitride film are layered in this order, and
heating the mutlilayered film.

9. The method according to claim 8,
wherein in the forming of the electrode layer, an electrode layer containing titanium, aluminum, and nitrogen is formed.

10. The method according to claim 8, wherein the heating of the multilayered film layer converts the multilayered film layer to an alloyed film layer.

11. The method according to claim 8,
wherein in the selectively forming of the third electrode, a third electrode containing at least any one of titanium, molybdenum, tungsten, and nitrogen is formed.

12. The method according to claim 8,
wherein after forming the second insulating film, a barrier film is formed on the second insulating film.

13. The method according to claim 8,
wherein in the forming the first opening, the second opening, and the third opening, the first opening is shifted from a center portion of the third electrode toward a side of the third opening and in the direction of the third opening.

14. A method of forming a semiconductor device, comprising:
providing a semiconductor substrate;
depositing, by chemical vapor deposition, a multilayer semiconductor stack on the semiconductor substrate;
depositing a first insulating film layer over the multilayer semiconductor stack;
forming a first metal electrode on the first insulating layer;
depositing a second insulating layer on the first insulating layer and the first metal electrode;
extending a first opening, a second opening and a third opening through the third insulating layer, the first opening extending onto the first metal electrode, the second and the third openings extending through the second insulating layer and through the first insulating layer and exposing the surface of the multilayer semiconductor stack; and
providing a second metal electrode in the second opening and in contact with the multilayer semiconductor stack, a third metal electrode in the third opening and in contact with the multilayer semiconductor stack, and a fourth metal electrode in the third opening and in contact with the first metal electrode, wherein
the second electrode, the third electrode and the fourth electrode are formed by:
depositing a multi-layered metal film in which a titanium film, an aluminum film, a titanium film, and a titanium nitride film are layered in this order; and
alloying the multi-layered metal film into a single film layer by heating.

15. The method of claim 14, further comprising:
heating the substrate to form an Ohmic contact between the first metal electrode and the multilayer semiconductor stack, between the second metal electrode and the multilayer semiconductor stack, and between the third metal electrode and the semiconductor stack.

16. The method of claim 15, wherein heating the substrate to form an Ohmic contact between the first metal electrode and the multilayer semiconductor stack, between the second metal electrode and the multilayer semiconductor stack, and between the third metal electrode and the semiconductor stack comprises:

heating the substrate to a temperature of between 500° C. and 550° C.

17. The method of claim 14, wherein the semiconductor stack comprises gallium.

18. The method of claim 14, further comprising:

forming a barrier film extending between portions of the second, third and fourth electrodes and the second insulating layer.

19. The device according to claim 1, wherein a distance along the first direction from the end portion of the fourth electrode to the second electrode is greater than a distance along the first direction from the end portion of the fourth electrode to the third electrode.

20. The device according to claim 1, further comprising:

a fifth electrode connected to the first electrode and having an portion above the first third and fourth electrode in a second direction perpendicular to the first direction, an end portion of the fifth electrode being in above, in the second direction, a position between the end portion of the fourth electrode and the second electrode along the first direction.

* * * * *